United States Patent
Mui et al.

(10) Patent No.: US 7,262,865 B2
(45) Date of Patent: Aug. 28, 2007

(54) METHOD AND APPARATUS FOR CONTROLLING A CALIBRATION CYCLE OR A METROLOGY TOOL

(75) Inventors: David Mui, Fremont, CA (US); Hiroki Sasano, Sunnyvale, CA (US); Wei Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 401 days.

(21) Appl. No.: 10/788,498

(22) Filed: Feb. 26, 2004

(65) Prior Publication Data

US 2005/0190381 A1    Sep. 1, 2005

(51) Int. Cl.
*G01B 11/28* (2006.01)
*G01B 11/02* (2006.01)
*G12B 13/00* (2006.01)

(52) U.S. Cl. ............. 356/630; 250/252.1; 702/40; 702/85; 702/97; 702/172

(58) Field of Classification Search ......... 356/630, 356/237.1, 237.2
See application file for complete search history.

(56) References Cited

U.S. PATENT DOCUMENTS

| | | | |
|---|---|---|---|
| 6,245,581 B1 * | 6/2001 | Bonser et al. | 438/8 |
| 6,281,818 B1 * | 8/2001 | Miller | 341/120 |
| 6,532,428 B1 * | 3/2003 | Toprac | 702/97 |
| 6,654,698 B2 * | 11/2003 | Nulman | 702/85 |
| 6,795,193 B2 * | 9/2004 | Schulz | 356/445 |
| 7,075,643 B2 * | 7/2006 | Holub | 356/326 |
| 2003/0223072 A1 * | 12/2003 | Schulz | 356/446 |

\* cited by examiner

*Primary Examiner*—Roy M. Punnoose
(74) *Attorney, Agent, or Firm*—Moser IP Law Group

(57) ABSTRACT

A method and apparatus for controlling when a calibration cycle is started for a metrology tool. The method and apparatus exploits a correlation between a drift of a first parameter (e.g., film thickness measurement drift) and a drift of a second parameter (e.g., CD measurement drift). One embodiment of the method comprises measuring a film thickness on one or more reference substrates to determine when a drift component of these measurements exceeds a pre-determined range and thereafter calibrating the metrology tool when the drift component of the film thickness measurements exceeds the pre-determined range. Generally, the drift of the film thickness measurement will occur prior to substantial drift of the CD measurement occurring.

15 Claims, 3 Drawing Sheets

METHOD AND APPARATUS FOR CONTROLLING A CALIBRATION CYCLE OR A METROLOGY TOOL

BACKGROUND OF THE INVENTION

1. Field of the Invention

The present invention generally relates to semiconductor substrate processing systems. More specifically, the present invention relates to a method and apparatus for controlling the calibration cycle of a metrology tool.

2. Description of the Related Art

Ultra large scale integrated (ULSI) circuits may include more than one million micro-electronic devices (e.g., transistors, capacitors, interconnecting lines, and the like) that are formed on a substrate (e.g., a silicon (Si) wafer) and which cooperate to perform various functions within the device. Fabrication of the electronic devices includes processes in which one or more layers of a film stack of such a device are deposited or etched, thereby forming one or more structures of the device being fabricated.

During manufacturing processes, topographic dimensions of structures formed on the substrates are measured to verify that the substrate processing reactors are operating within the desired ranges that facilitate high yield and productivity. One typical procedure comprises measuring the smallest widths of the structures, such as lines, columns, openings, spaces between the lines, and the like. Such widths are known as "critical dimensions", or CDs, and are generally the most difficult elements of a structure to fabricate and measure. In advanced ULSI circuits, the critical dimensions generally are deep sub-micron dimensions having a nominal value of less than about 0.18 microns.

Metrology tools for performing critical dimension (CD) measurements of topographic structures require periodic calibration to ensure the measurements remain accurate. Generally, metrology tools are calibrated based on a predetermined number of measurements performed since the most recent calibration or, alternatively, based on a time duration that has passed since a previous calibration. These methods of determining when the metrology tool should be calibrated are referred to as "timed" calibrations. Such a timed calibration does not assess actual performance of the metrology tool between calibration cycles such that inaccurate tool performance (e.g., invalid or inaccurate CD measurements) may occur before a calibration cycle is begun. Since CD measurements are used to control process parameters, processing a substrate based upon an incorrect CD measurement can destroy one or more substrates. Furthermore, such "timed" calibration may cause calibration of the tool when such calibration is unnecessary. Consequently, substrate processing throughput may be unnecessarily impacted.

Therefore, there is a need in the art for a method and apparatus for anticipating when a metrology tool requires calibration such that the use of a calibration cycle can be accurately controlled.

SUMMARY OF THE INVENTION

The present invention is a method and apparatus for controlling when a calibration cycle is started for a metrology tool. The method and apparatus exploits a correlation between a drift of a first parameter (e.g., film thickness measurement drift) and a drift of a second parameter (e.g., CD measurement drift). One embodiment of the method comprises measuring a film thickness on one or more reference substrates to determine when a drift of these thickness measurements exceeds a pre-determined range and thereafter calibrating the metrology tool. Generally, the drift of the film thickness measurement will occur prior to substantial drift of the CD measurement occurring. Thus, the risk of destroying substrates by using an inaccurate CD measurement is substantially reduced.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

It is to be noted, however, that the appended drawings illustrate only exemplary embodiments of this invention and are therefore not to be considered limiting of its scope, for the invention may admit to other equally effective embodiments.

DETAILED DESCRIPTION

The present invention is a method for anticipating when a metrology tool requires calibration. The method monitors actual performance of a metrology tool to determine when the metrology tool requires a calibration. A metrology tool such as a NanoSpec 9000 series available from Nanometrics, Inc. of Milpitas, Calif. can measure both film thickness and the critical dimensions (CD) of structures on a substrate. In one embodiment of the invention, such a metrology tool is a component of an integrated substrate processing system used to fabricate topographic structures on substrates.

The invention exploits the discovery that the drift of a first parameter (e.g., film thickness measurement drift of the metrology tool) anticipates the drift of a second parameter (e.g., CD measurement drift of the tool). Since film thickness measurement drift is less critical to substrate processing than CD measurement drift, the invention uses the thickness measurement drift to initiate a calibration cycle prior to the CD measurement drift becoming large enough to result in substrate damage.

Figure 1:
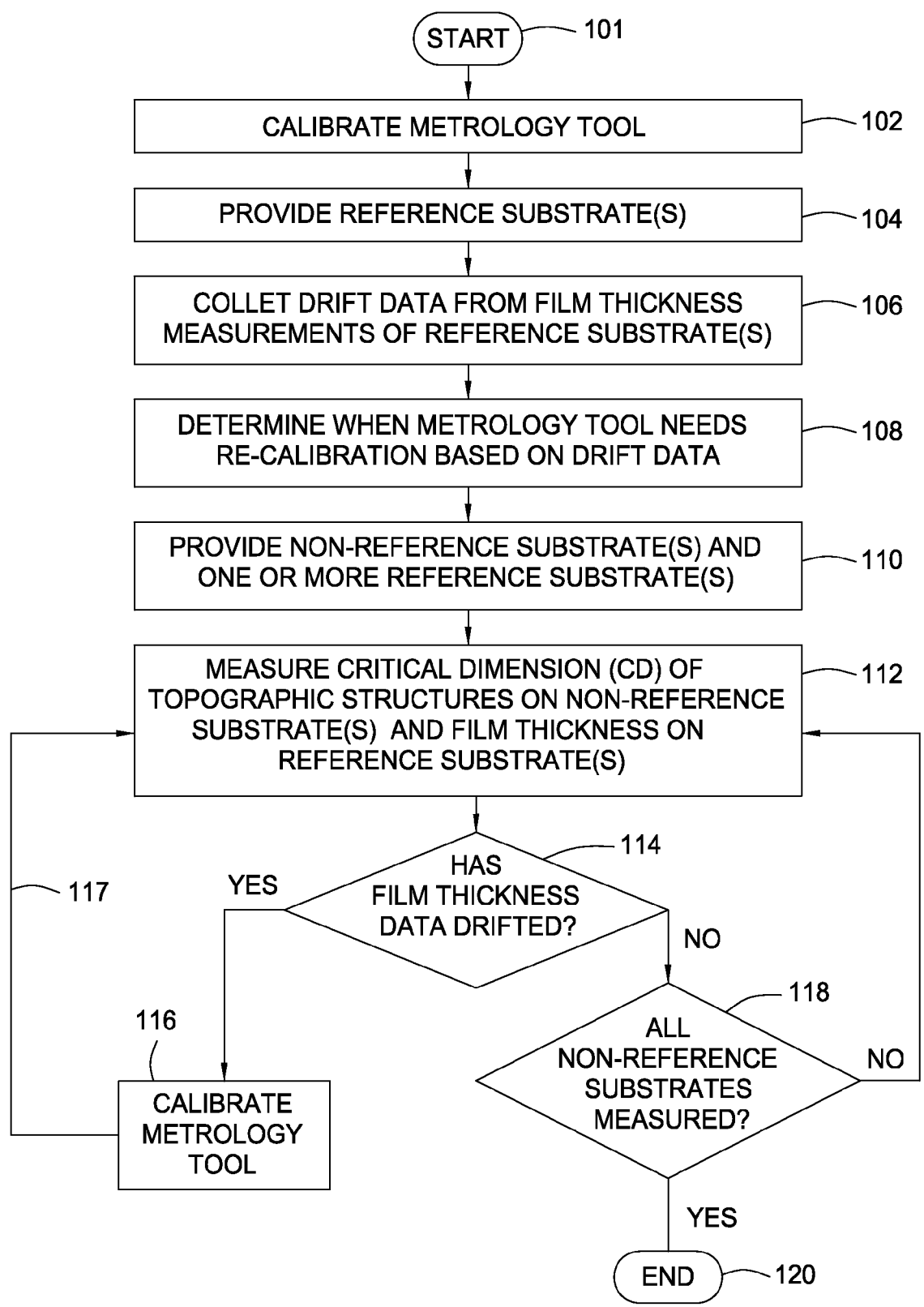
FIG. 1 depicts a flow diagram of a method for anticipating when a metrology tool requires calibration in accordance with one embodiment of the present invention.

FIG. 1 depicts a flow diagram of one embodiment of the inventive method 100 for controlling calibration of a metrology tool.

The method 100 starts at step 102 and proceeds to step 104, wherein the metrology tool is calibrated. In one exemplary embodiment, the metrology tool is a NanoSpec 9000 series used within a TRANSFORMA™ system available from Applied Materials, Inc. of Santa Clara, Calif. The metrology tool may use one or more non-destructive optical measuring techniques, such as spectroscopy, interferometry, scatterometry, reflectometry, ellipsometry, and the like. The measured parameters include a thickness for patterned and blanket dielectric and/or conductive films, as well as topographic dimensions and profiles of structures fabricated using such films. As such, the metrology tool provides both film thickness and CD measurements.

Figure 2:
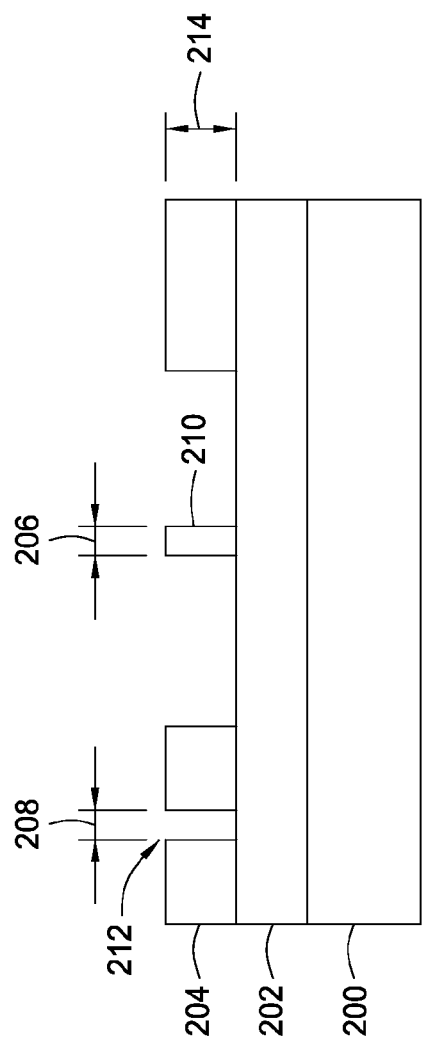
FIG. 2 depicts a schematic, cross-sectional view of a reference substrate fabricated in accordance with the method of FIG. 1.

At step 106, one or more reference substrates are provided to the metrology tool. FIG. 2 depicts a schematic, cross-sectional view of an exemplary reference substrate 200, e.g., silicon wafer. The illustration in FIG. 2 is not depicted to scale and is simplified for illustrative purposes. The substrate 200 illustratively comprises a reference layer 204 formed on a material layer 202. The reference layer 204 has a known thickness 214. The reference layer 204 has a plurality of structures 210 and/or a plurality of features 212 formed therein. The widths of the structures and features are known. In one embodiment, dimensions for the reference layer thickness 214 and widths 206, 208 are selected to correspond approximately to the dimensions of the thickness and widths of the structures and/or features to be formed on non-reference wafers (e.g., product wafers) that are to be measured using the metrology tool.

At step 108, the metrology tool measures the thickness 214 of the reference layer 204 and, optionally, the width 206 of the structures 210 and/or features 212 on the reference substrate(s) 200. A single reference substrate may be measured or multiple reference substrates measured and the measurement averaged. To anticipate when the metrology tool will require calibration again, the method 100 tracks the drift of the thickness measurement. To identify the drift, the reference substrate is periodically reintroduced to the metrology tool to facilitate periodic thickness measurements. The method determines the change in the newly measured thickness with respect to the originally measured thickness as thickness measurement drift (i.e., the current thickness is subtracted from the original thickness).

At step 110, the schedule for periodically reintroducing the reference substrate or substrates is established. Multiple reference substrates may be measured to establish an average thickness value. Such a schedule may be defined by time, e.g., a reference substrate is moved to the metrology tool every 10 minutes, or by substrate number, e.g., a reference substrate is moved to the metrology tool after every 20 wafers are processed. The schedule may or may not be periodic, e.g., reference substrates reintroduction may be spaced far apart just after a calibration and be spaced closely after a predefined time or number of product substrates.

At step 112, the method 100 queries whether the schedule indicates that it is time to reintroduce a reference substrate. If the query is negatively answered, at step 122, a non-reference substrate (product substrate) is introduced into the metrology tool. At step 124, the method measures the CD of the non-reference substrate. The method 100 then proceeds along path 126 to step 112 to query whether it is time for a reference substrate to be measured.

If, at step 112, the method 100 determines that a reference substrate is required, then, at step 114, a reference substrate (or substrates) is provided to the metrology tool. At step 116, the metrology tool measures the film thickness on the reference substrate. At step 118, the thickness measurement drift is determined. The drift is the difference between the original thickness measurement (determined in step 108) and the present thickness measurement. At step 120, the drift is compared to a threshold level to determine if the drift is excessive. An excessive drift in a thickness measurement is indicative that soon the CD measurement will have drifted to an unacceptable level. An inaccurate CD measurement can cause severe damage to one or more substrates that are processed in a manner that relies on the inaccurate CD measurement.

If, at step 120, an excessive thickness measurement drift is determined, the method 100 proceeds on path 123 to step 104 wherein the metrology tool is calibrated. On the other hand, if the drift is found to be within limits, (i.e., not excessive), the method 100 proceeds to step 112.

Figure 3:
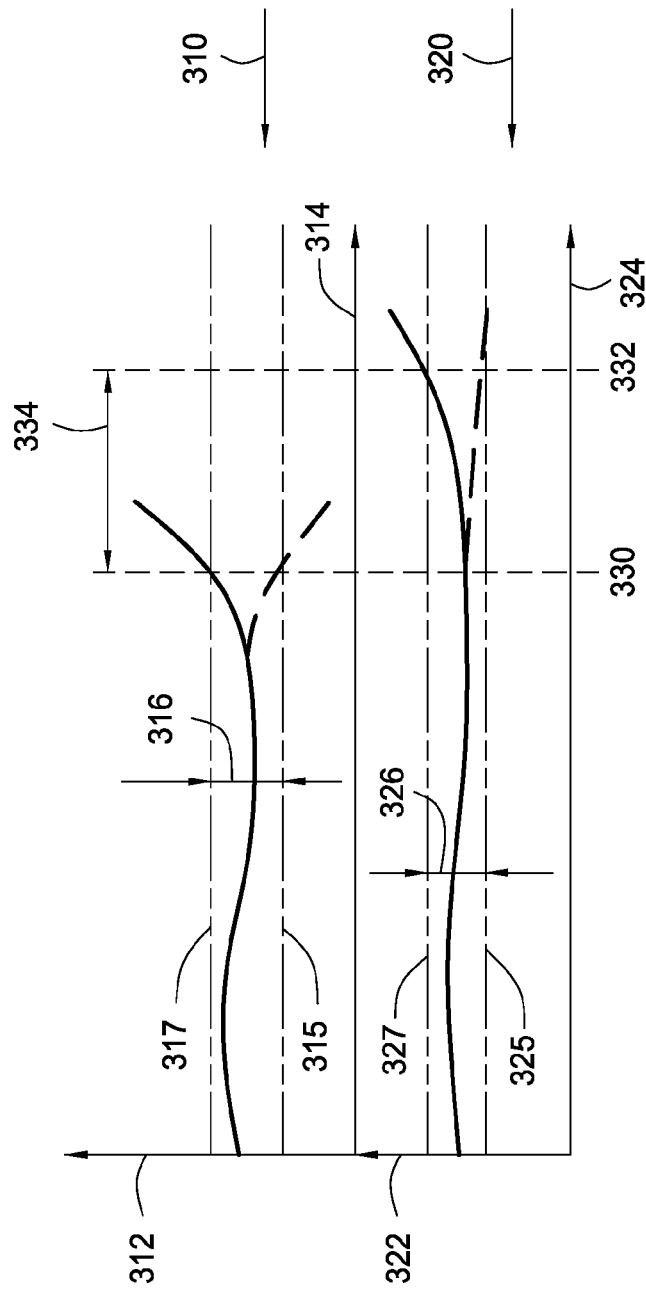
FIG. 3 depicts a series of exemplary timing diagrams showing the results of measurements performed on a reference substrate.

FIG. 3 depicts a graph that illustrates the results of periodic measurements performed on the reference substrate 200 (FIG. 2). A first graph 310 depicts the thickness measurement drift results (y-axis 312) of the reference layer 204 versus time (x-axis 314). The drift values are the difference between the thickness measured for a currently used reference substrate and the thickness measured on the original reference substrate. A second graph 320 depicts the CD measurement drift results (y-axis 322) versus time (x-axis 324). The measurements of the thickness and CD are valid and useful when the results of such measurements remain within pre-determined ranges 316 (thickness) and 326 (CD) having lower limits 315 and 325 and upper limits 317 and 327, respectively. The results of measuring the thickness and CD are illustratively depicted in FIG. 3 as drifting over time in positive directions (i.e., beyond the limits 317, 327) of the respective axes 312 and 322, however, such results may similarly drift in the opposite directions (i.e., beyond the limits 315, 325), as shown using broken lines.

The results of measuring the thickness begin drifting beyond the pre-determined range 316 at a moment 330 preceding the moment 332 when the results of measuring the CD begin a statistically significant drift beyond the respective pre-determined range 326. Therefore, the moment 330 is used to identify when the tool requires recalibration. As such, the recalibration cycle is begun before the CD measurements have attained a critical drift that could result in wafer damage.

Figure 4:
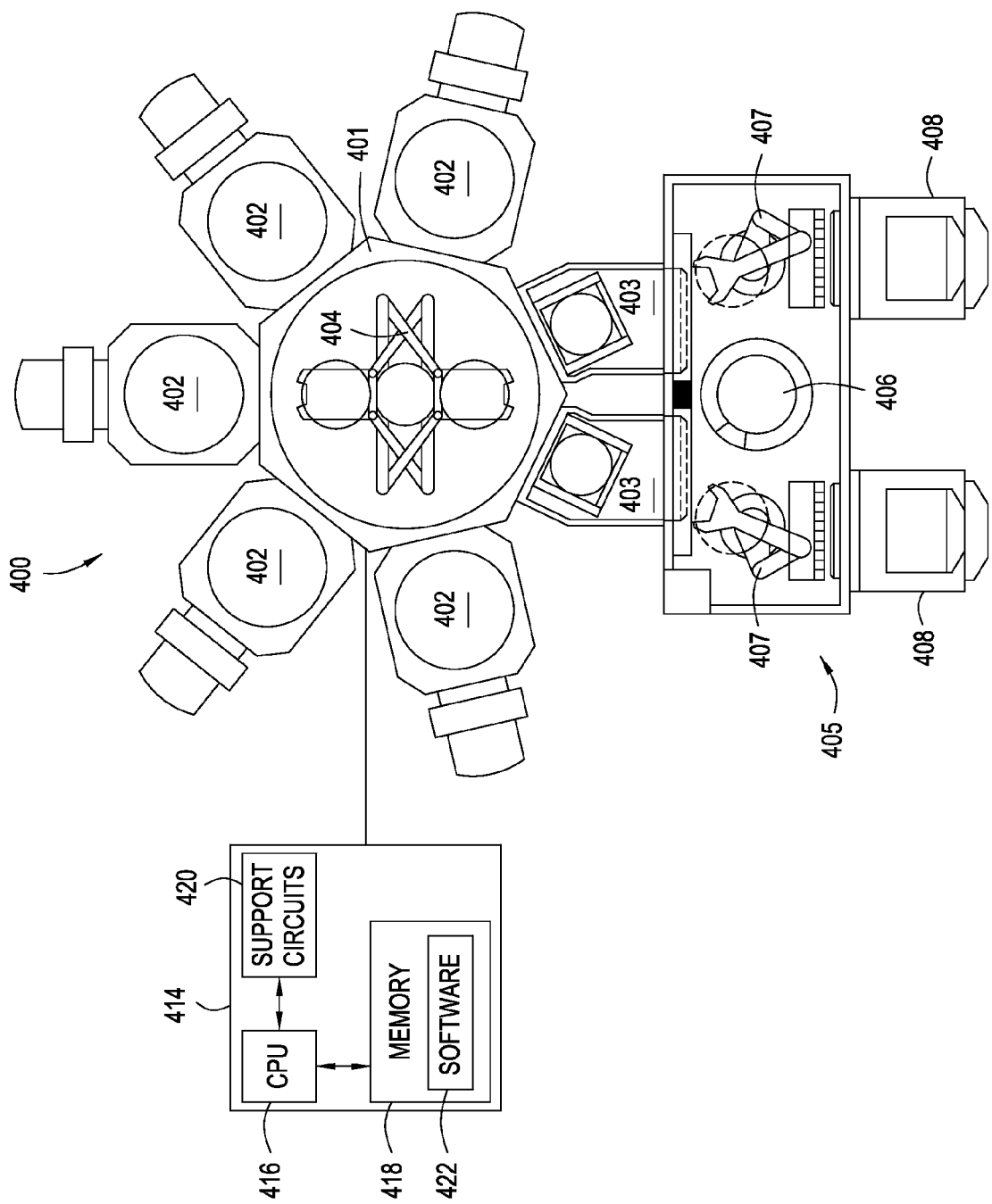
FIG. 4 depicts a schematic diagram of an exemplary integrated semiconductor substrate processing system of the kind used in performing portions of the inventive method.

An example of an etch system that is integrated with an ex-situ metrology tool with the capability of measuring CDs and film thickness is Applied Materials' TRANSFORMA™ system 400 (FIG. 4). Detailed information describing Applied Materials' TRANSFORMA™ system has been disclosed in a commonly assigned U.S. patent application Ser. No. 10/428,145, titled "Method and Apparatus for Controlling Etch Processes During Fabrication of Semiconductor Devices", filed on May 1, 2003. The system comprises a controller 414, a chamber or "mainframe" 401, such as the CENTURA™ processing system for mounting a plurality of processing chambers 402, e.g., conventional etch reactors, such as the DPSII™ silicon etch chambers, photoresist stripping chambers, such as the AXIOM® from Applied Materials, Inc., and one or more transfer chambers 403, also called "load locks". In one embodiment of the present invention, two etch processing chambers and two photoresist stripping chambers are mounted to the mainframe 401. A robot 404 is provided within the mainframe 401 for transferring substrates between the processing chambers 402 and the transfer chambers 403. The transfer chambers 403 are connected to a factory interface 405, also known as a "mini environment" that maintains a controlled environment for the substrates.

The factory interface 405 comprises a pair of robots 407 that move substrates from at least one tool buffer 408 (e.g., at least one front opening unified pod (FOUP)). The tool buffer 408 comprises a plurality of substrates (not shown). These substrates comprise one or more reference substrates and non-reference substrates. The robots 407 move the non-reference substrates to/from the metrology tool 406 and the load locks 403. The robot 404 moves the non-reference substrates from the load locks 403 to the process chambers 402 as well as amongst the process chambers 402. In accordance with the invention, a reference substrate is moved to the metrology tool 406 to determine metrology tool measurement drift and to perform metrology tool calibration.

The metrology tool 406 is integrated in the factory interface 405 and provides high-speed data collection and analysis for one or more substrates that enter the system 400. In accordance with one embodiment of the present invention, the metrology tool 406 is capable of measuring both CD and film thickness. Such a tool is a NanoSpec 9000 series tool available from NanoMetrics, Inc. In other embodiments of the invention, two or more metrology tools may be used to measure film CD and thickness. The metrology tool 406 could also be placed at different location within the process system 400 or be located separate from the processing system.

The controller 414 comprises a central processing unit (CPU) 416, a memory 418, and support circuits 420. The CPU 416 may be any form of general-purpose computer processor that can be programmed to perform the method of the present invention. Control software 422 can be stored in memory 418, such as random access memory, read only memory, removable storage, hard disk storage or any combination thereof. The support circuits 420 are conventionally coupled to the CPU 416 and may comprise cache, clock circuits, input/output subsystems, power supplies and the like. In operation, the CPU 416 executes the control software 422 which, in part, causes the TRANSFORMA™ system 400 to perform the method (100 in FIG. 1) of the present invention.

The invention may be practiced using other etch processes wherein parameters may be adjusted to achieve acceptable characteristics by those skilled in the arts by utilizing the teachings disclosed herein without departing from the spirit of the invention.

The invention may be practiced using other semiconductor substrate processing systems wherein the processing parameters may be adjusted to achieve acceptable characteristics by those skilled in the arts by utilizing the teachings disclosed herein without departing from the spirit of the invention.

While the foregoing is directed to the illustrative embodiment of the present invention, other and further embodiments of the invention may be devised without departing from the basic scope thereof, and the scope thereof is determined by the claims that follow.

What is claimed is:

1. A method for controlling calibration timing for a metrology tool, comprising:
   (a) calibrating a metrology tool using a first parameter measured on at least one reference substrate;
   (b) measuring a second parameter on at least one non-reference substrate using the metrology tool;
   (c) measuring the first parameter of at least one film on at least one reference substrate using the metrology tool;
   (d) determining when a first parameter measurement drift with respect to the calibrated first parameter measurement exceeds a pre-determined value; and
   (e) calibrating the metrology tool in response to the first parameter measurement drift exceeding the predetermined value.

2. The method of claim 1, wherein the first parameter is film thickness.

3. The method of claim 2 further comprising determining drift by subtracting the film calibrated thickness measurement from the thickness measurement of step (c).

4. The method of claim 3, wherein the metrology tool is an optical measuring tool.

5. The method of claim 3, wherein the non-reference substrates are product substrates.

6. The method of claim 1, wherein the second parameter is a critical dimension.

7. The method of claim 6, wherein the calibrating begins prior to excessive drift occurring for the critical dimension measurements performed by the metrology tool.

8. The method of claim 7 further comprising performing the first parameter measurements on a plurality of substrates.

9. The method of claim 1, wherein the first parameter is film thickness and the second parameter is a critical dimension.

10. The method of claim 1 wherein the metrology tool is an optical measuring tool.

11. The method of claim 1 wherein the non-reference substrates are product substrates.

12. The method of claim 11, wherein the predefined schedule is a periodic time.

13. The method of claim 11, wherein the predefined schedule is defined by measuring a predefined number of non-reference substrates.

14. The method of claim 1 wherein steps (a) and (c) further comprise:
   averaging the results of a plurality of said first parameter measurements.

15. The method of claim 1 wherein step (c) is performed in accordance with a predefined schedule.

* * * * *

UNITED STATES PATENT AND TRADEMARK OFFICE
CERTIFICATE OF CORRECTION

| | |
|---|---|
| PATENT NO. | : 7,262,865 B1 |
| APPLICATION NO. | : 10/788498 |
| DATED | : August 28, 2007 |
| INVENTOR(S) | : Mui et al. |

It is certified that error appears in the above-identified patent and that said Letters Patent is hereby corrected as shown below:

On the title page, in field (54), in "Title", in column 1, line 3, delete "OR" and insert -- OF --, therefor.

In column 1, line 3, delete "OR" and insert -- OF --, therefor.

Signed and Sealed this

Twenty-seventh Day of November, 2007

JON W. DUDAS
*Director of the United States Patent and Trademark Office*